US011244962B2

(12) United States Patent
Chen et al.

(10) Patent No.: US 11,244,962 B2
(45) Date of Patent: Feb. 8, 2022

(54) DISPLAY SUBSTRATE, DISPLAY DEVICE, MOBILE TERMINAL AND FABRICATING METHOD OF DISPLAY SUBSTRATE

(71) Applicants: Chengdu BOE Optoelectronics Technology Co., Ltd., Sichuan (CN); BOE TECHNOLOGY GROUP CO., LTD., Beijing (CN)

(72) Inventors: Peng Chen, Beijing (CN); Yang Wang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 6 days.

(21) Appl. No.: 16/521,530

(22) Filed: Jul. 24, 2019

(65) Prior Publication Data

US 2020/0219902 A1 Jul. 9, 2020

(30) Foreign Application Priority Data

Jan. 4, 2019 (CN) .......................... 201910009305.1

(51) Int. Cl.
*H01L 27/12* (2006.01)
*H05K 5/00* (2006.01)
*H05K 5/03* (2006.01)

(52) U.S. Cl.
CPC ........ *H01L 27/1218* (2013.01); *H01L 27/124* (2013.01); *H01L 27/1262* (2013.01); *H05K 5/0017* (2013.01); *H05K 5/03* (2013.01)

(58) Field of Classification Search
CPC ............... H01L 27/1218; H01L 27/124; H01L 27/1262; H01L 27/1244; H01L 27/1248; H01L 27/1259; H05K 5/0017; H05K 5/03; G02F 1/133305
See application file for complete search history.

(56) References Cited

U.S. PATENT DOCUMENTS

2019/0036068 A1* 1/2019 Kim ...................... G06F 1/1641
2019/0206959 A1* 7/2019 Jung ................... H01L 27/1214

FOREIGN PATENT DOCUMENTS

| CN | 104659062 A | 5/2015 |
|----|-------------|--------|
| CN | 104752485 A | 7/2015 |
| CN | 106486520 A | 3/2017 |

(Continued)

OTHER PUBLICATIONS

Chinese Office Action dated Apr. 27, 2020, from application No. 201910009305.1.

*Primary Examiner* — Edward Chin
(74) *Attorney, Agent, or Firm* — Thomas | Horstemeyer, LLP (57) ABSTRACT

The present disclosure provides a display substrate, a display device, a mobile terminal, and a fabricating method of a display substrate. The display substrate includes a bending region and a non-bending region adjacent to the bending region. At least a portion of the non-bending region is provided with an inorganic layer, and at least a portion of the bending region is provided with a flexible filling layer. The display substrate further includes a stretching structure layer disposed in the bending region, and the stretching structure layer and the flexible filling layer are alternately distributed.

7 Claims, 6 Drawing Sheets (56) References Cited

FOREIGN PATENT DOCUMENTS

| CN | 107799553 A | 3/2018 |
| CN | 107994055 A | 5/2018 |
| CN | 207398180 U | 5/2018 |
| CN | 109755256 A | 5/2019 |

\* cited by examiner

DISPLAY SUBSTRATE, DISPLAY DEVICE, MOBILE TERMINAL AND FABRICATING METHOD OF DISPLAY SUBSTRATE

CROSS-REFERENCE TO RELATED APPLICATIONS

The present application is based on and claims priority to Chinese Patent Application No. 201910009305.1, filed on Jan. 4, 2019, the entire contents of which is incorporated herein by reference.

TECHNICAL FIELD

The present disclosure relates to the field of display device technologies, and in particular, to a display substrate, a display device, a mobile terminal, and a fabricating method of a display substrate.

BACKGROUND

With the rapid development of economy and technology, consumer mobile terminals represented by mobile phones are rapidly popularized. As the most important component of a mobile phone, the array substrate has also been rapidly developed. As consumers require an array substrate with increasingly higher requirements, terminal manufacturers constantly seek differentiations in the ID design of a product. Currently, there are two solutions for the 3D appearance design of a mobile phone. One solution is to move the edge line of the array substrate towards the center. The other solution is to design the array substrate of the entire mobile phone into a large curved surface structure. It is, however, still desirable to maintain the narrow design of the bottom frame of the array substrate, so that a Pad Bending technology may be required. Therefore, the Pad bending region of the array substrate may be curved, which may cause stress concentration or wrinkles of the Pad bending region along the bending line and thus the attaching problem, and which may also lead to short lines or broken defects.

SUMMARY

In accordance with one aspect of the present disclosure, a display substrate is provided, including a bending region and a non-bending region adjacent the bending region. At least a portion of the non-bending region is provided with an inorganic layer, and at least a portion of the bending region is provided with a flexible filling layer. The display substrate further includes a stretching structure layer disposed in the bending region, and the stretching structure layer and the flexible filling layer are alternately distributed.

According to one of arrangements of the present disclosure, the stretching structure layer is made of polydimethylsiloxane.

According to one of arrangements of the present disclosure, at least a portion of the bending region is provided with the inorganic layer.

According to one of arrangements of the present disclosure, the inorganic layer includes a barrier dam disposed in the bending region, and the barrier dam is provided between each of stretching structure layers and the flexible filling layer on both sides thereof, respectively.

According to one of arrangements of the present disclosure, the inorganic layer includes a buffer layer, a gate insulating layer, and a inter layer dielectric. The buffer layer is disposed on the display substrate. The gate insulating layer is disposed on the buffer layer. The inter layer dielectric is disposed on the gate insulating layer.

According to one of arrangements of the present disclosure, the inorganic layer includes two gate insulating layers sequentially disposed on the buffer layer.

According to one of arrangements of the present disclosure, the stretching structure layer is configured as a wavy structure.

In accordance with another aspect of the present disclosure, a display device including a cover and a display substrate is provided. The display substrate is the display substrate proposed in the present disclosure and described in the above arrangements. The display substrate is attached to the cover.

According to one of arrangements of the present disclosure, the cover has a middle portion and two side portions on both sides of the middle portion, the middle portion is a planar structure, the side portion is a curved surface structure, and positions at which the two side portions are connected to the middle portion define two curved boundary lines, respectively. The display substrate includes two stretching structure layers, and extensions of the two curved boundary lines on an upper surface of the cover passes through orthographic projections of the two stretching structure layers on the upper surface of the cover, respectively.

According to one of arrangements of the present disclosure, the cover is a curved surface structure integrally bent in a first direction which is parallel to a length direction of the bending region of the display substrate. At least one of the stretching structure layers of the display substrate includes at least one first stretching structure layer located at a middle position of the bending region.

According to one of arrangements of the present disclosure, at least one of the stretching structure layers of the display substrate further includes two second stretching structure layers located at both sides of the first stretching structure layer in a length direction of the bending region, respectively.

In accordance with still another aspect of the present disclosure, a mobile terminal is provided, including a display screen. The display screen includes the display device proposed in the present disclosure and described in the above arrangements.

In accordance with yet another aspect of the present disclosure, a fabricating method of a display substrate includes providing a substrate, the substrate including a bending region and a non-bending region adjacent to the bending region; providing a flexible filling layer in at least a portion of the bending region of the substrate, and providing an inorganic layer in at least a portion of the non-bending region of the substrate; providing at least one stretching structure layer in the bending region, the stretching structure layer and the flexible filling layer being alternately arranged; and providing a metal routing, a planarization layer, and an organic film layer on the flexible filling layer, the inorganic layer, and the stretching structure layer.

According to one of arrangements of the present disclosure, the fabricating method of the display substrate further includes preheating and stretching the stretching structure layer and cooling the stretching structure layer to form a stretchable wavy structure.

DETAILED DESCRIPTION

Exemplary arrangements of the present disclosure will be described in detail in the following description. It should be understood that the present disclosure is capable of various modifications in the various arrangements without departing from the scope of the present disclosure, and the description and drawings thereof are intended to illustrate only and not limit the present disclosure.

The following description of the various exemplary arrangements of the present disclosure refers to the drawings, which constitute part of the present disclosure and show different exemplary structures, systems and operations implementing various aspects of the present disclosure by way of example. It should be understood that other specific aspects of components, structures, exemplary devices, systems and operations can be used, and structural and functional modifications can be made without departing from the scope of the present disclosure. Moreover, although the terms "above", "between", "inside" or the like may be used in this specification to describe various exemplary features and elements of the present disclosure, these terms are used herein only for convenience, for example, the direction according to the example shown in the drawings. Nothing in this specification should be construed as requiring a specific three dimensional orientation of the structure to fall within the scope of the disclosure.

Figure 1:
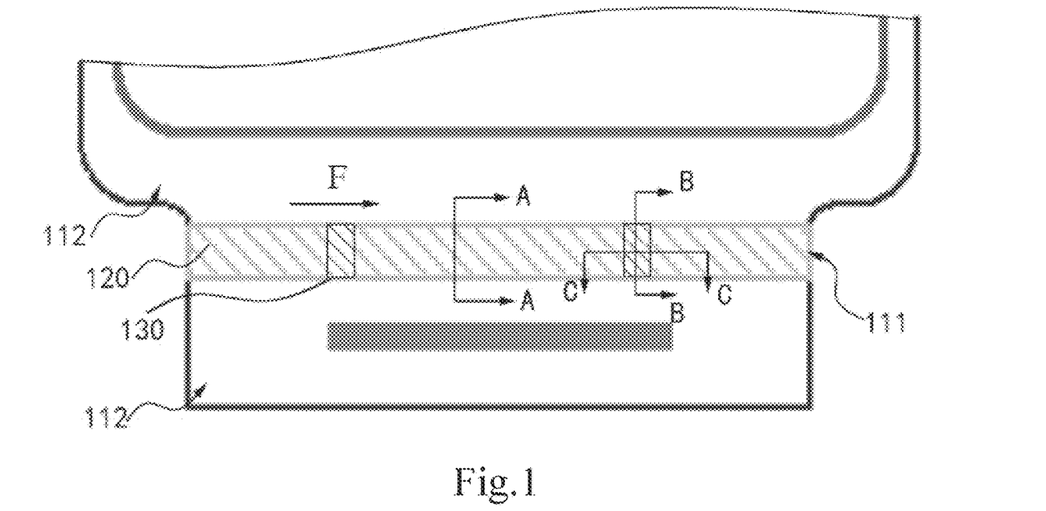
FIG. 1 is a partial structural view of a display substrate according to an exemplary arrangement.

Referring to FIG. 1, a schematic partial structural view of a display substrate provided by the present disclosure is representatively shown. In this first arrangement, the display substrate provided by the present disclosure is exemplified by a display substrate applied to a display device. It will be readily understood by those skilled in the art that various modifications, additions, substitutions, deletions or other variations are made to the specific arrangements described below in order to apply the related designs of the present disclosure to other types of display devices or other processes. These variations are still within the scope of the principles of the display substrate provided by the present disclosure.

Figure 2:
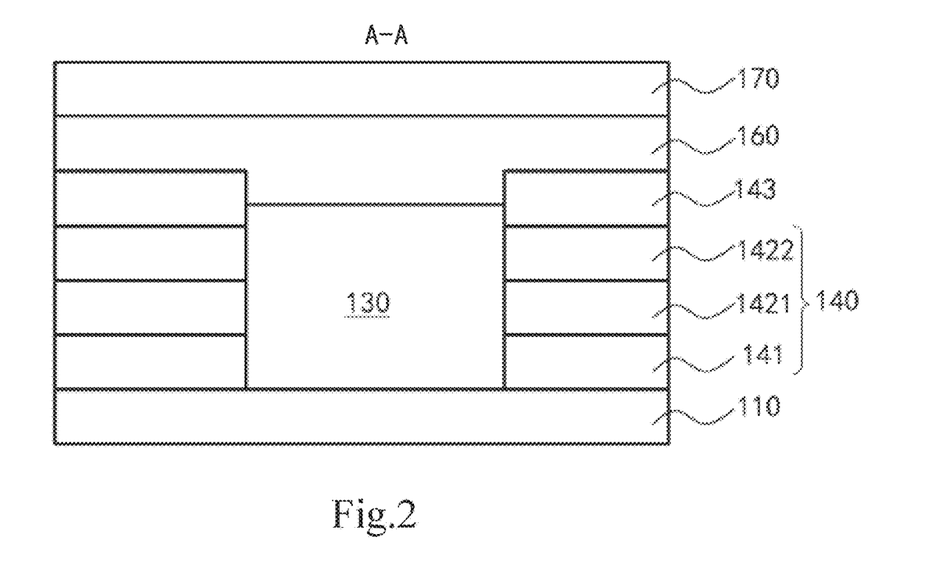
FIG. 2 is a partial cross-sectional view taken along line A-A of FIG. 1.
Figure 3:
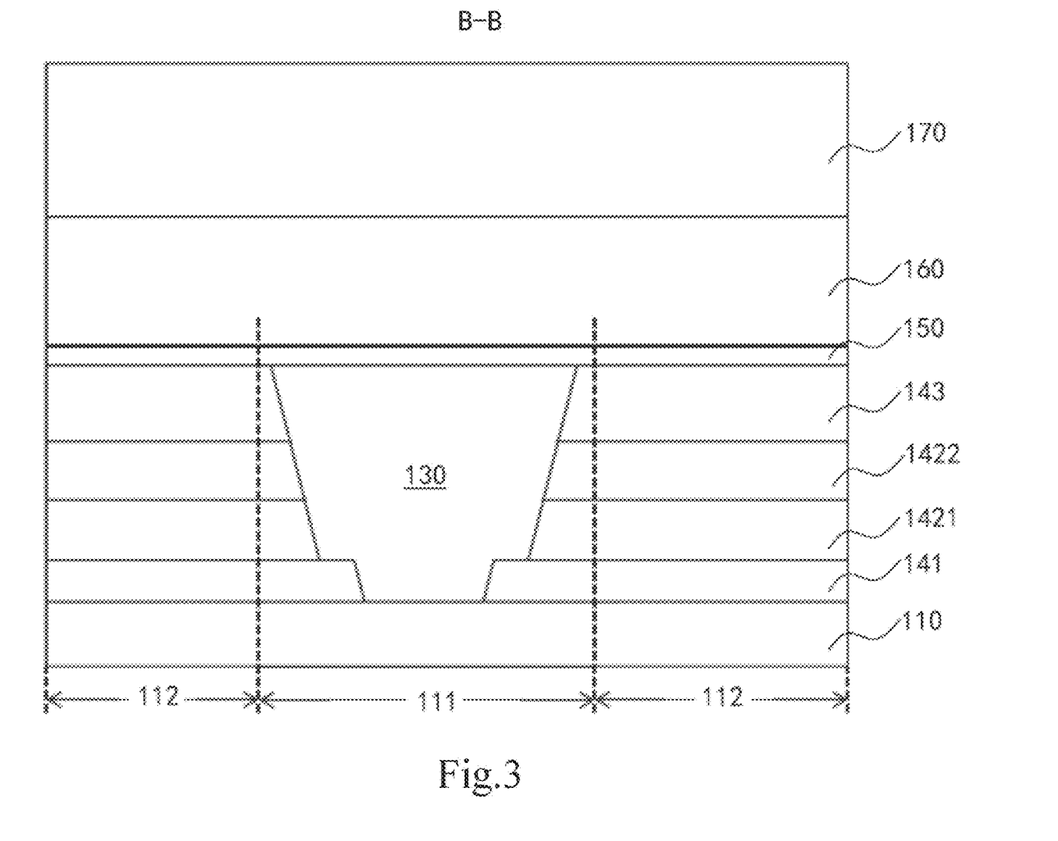
FIG. 3 is a partial cross-sectional view taken along line B-B of FIG. 1.
Figure 4:
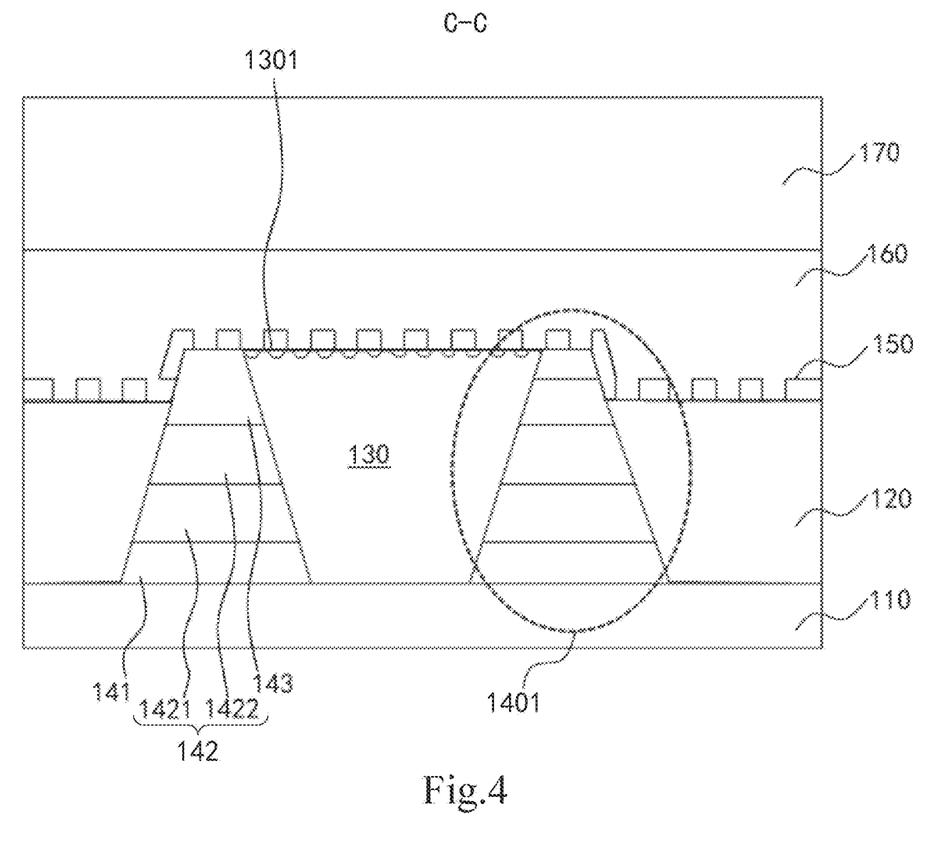
FIG. 4 is a partial cross-sectional view taken along line C-C of FIG. 1.

As shown in FIG. 1, in the present arrangement, the display substrate 110 proposed by the present disclosure includes a bending region 111 and a non-bending region 112 adjacent to the bending region 111. At least a portion of the non-bending region 112 is provided with an inorganic layer 140, and at least a portion of the bending region 111 is provided with a flexible filling layer 120. Further, in the present arrangement, a shape of the bending region 111 of the display substrate 110 is substantially strip-like rectangle, and the length direction F of the bending region 111 is the width direction of the display substrate. Referring to FIGS. 2 to 4, FIG. 2 representatively shows a partial cross-sectional view taken along line A-A in FIG. 1; FIG. 3 representatively shows a partial cross-sectional view taken along line B-B in FIG. 1; and FIG. 4 representatively shows a partial cross-sectional view taken along line C-C in FIG. 1. The structure, connection mode and functional relationship of the main components of the display substrate proposed by the present disclosure will be described in detail below with reference to the above drawings.

As shown in FIG. 1 to FIG. 4, in the present arrangement, the flexible filling layer 120 is disposed on the bending region 111 of the display substrate 110, and may be formed of a PI flexible material. A stretching structure layer 130 is further disposed on the bending region 111 of the display substrate 110, and the stretching structure layer 130 and the flexible filling layer 120 are disposed on the bending region 111 of the display substrate 110 in an alternating manner. The so-called "alternating" can be understood as that the stretching structure layer 130 and the flexible filling layer 120 are alternately arranged in the length direction F of the bending region 111, for example, in the structure shown in FIG. 1, along the length direction F of the bending region 111 from left to right, the flexible filling layer 120, the stretching structure layer 130, the flexible filling layer 120, the stretching structure layer 130, and the flexible filling layer 120 are successively arranged. These two stretching structure layers 130 disposed at different positions of the bending region 111 respectively define two stretching regions. Accordingly, according to the above design of the present disclosure, a stretching structure layer is disposed on the bending region of the display substrate, so that stress is released by the stretching structure layer at a position where stress concentration is expected to occur, and the bending region of the display substrate may be completely attached to the cover, such as CG (Cover Glass), of the new 3D structure to meet the attaching requirements, avoiding the short line or broken defects.

Figure 7:
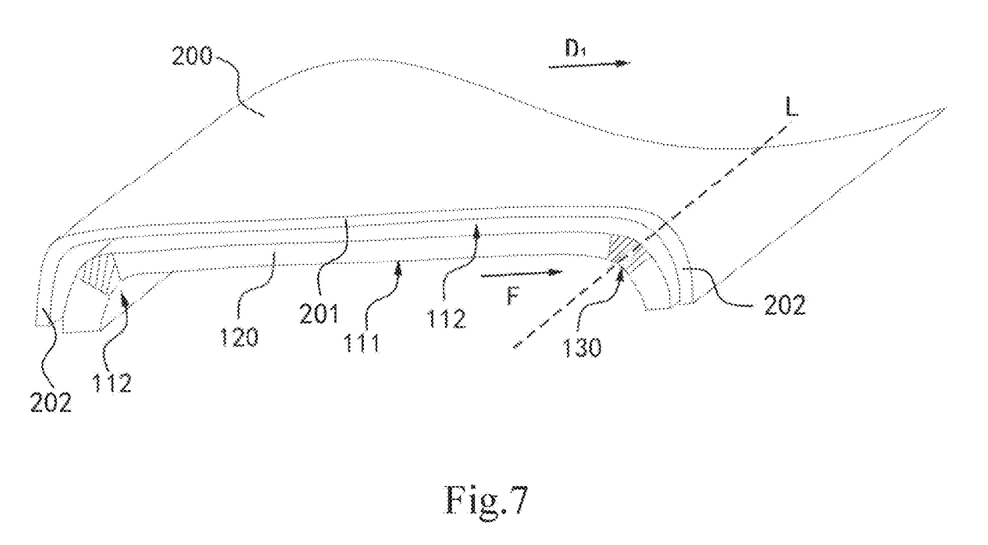
FIG. 7 is a partial perspective view of the display substrate shown in FIG. 1 when it is attached to a cover.

It should be noted that, as shown in FIG. 7, the display substrate 110 proposed by the present disclosure may be attached to the cover 200. In the present arrangement, the display substrate 110 may be intended to be attached to the cover 200 of the structure, i.e., the cover 200 has a middle portion 201 and two side portions 202 on both sides of the middle portion 201. The middle portion 201 is a planar structure, and the side portion 202 is a curved surface structure, so that the cover 200 is substantially a curved surface structure in which the side portions 202 are bent and the middle portion 201 is flat, and positions at which the middle portion 201 and two side portions 202 are connected define two curved boundary lines L, respectively. When attached with the cover 200 of the above structure, the display substrate 110 is bent into a structure that matches with the above-described cover 200. At this time, two curved boundary lines or extension lines thereof (referring to the curved boundary line shown in FIG. 7) respectively pass through the orthographic projections of the two stretching structure layers 130 on the cover 200, that is, two stretching structure layers 130 correspond to positions of the two curved boundary lines, respectively. In other arrangements, depending on the different curved surface design of the cover, or depending on different requirements for attaching with the cover, the stretching structure layer 130 may also be in other numbers or other arrangements, which will specifically be exemplified in other arrangements of the display substrate 110 described below, and will not be limited to this arrangement.

Further, in the present arrangement, a material of the stretching structure layer 130 may be polydimethylsiloxane (abbreviated as PDMS, otherwise known as silicone with chemical formula $[C_2H_6OSi]_n$). In other arrangements, the material of the stretching structure layer 130 may also be selected from other materials having tensile properties, and is not limited to the arrangement.

Figure 5:
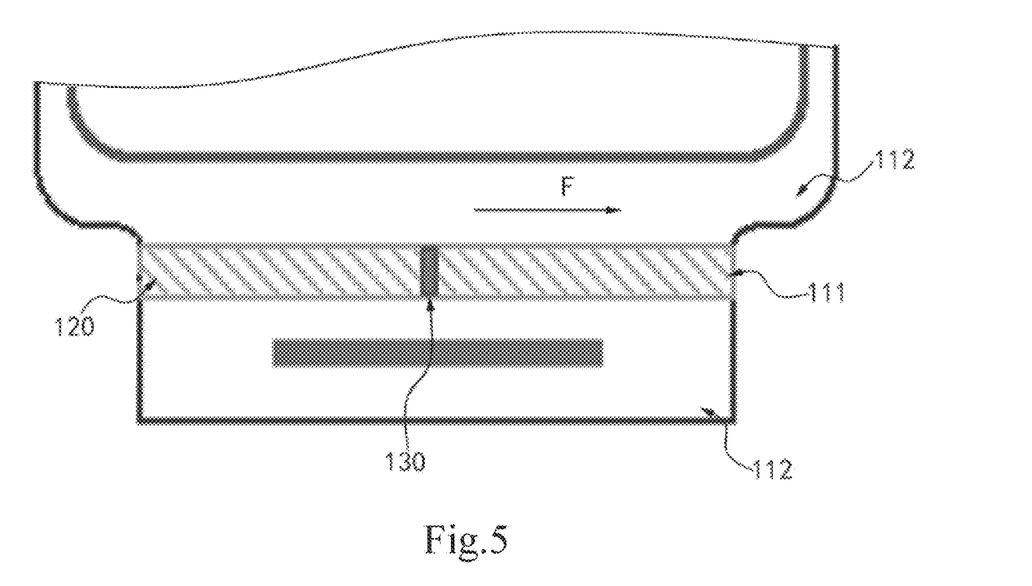
FIG. 5 is a partial structural view of a display substrate according to another exemplary arrangement.

Further, in the present arrangement, taking the material of the stretching structure layer 130 as a polydimethylsiloxane, the stretching structure layer 130 can be formed by: as shown in FIG. 4 and FIG. 5, the polydimethylsiloxane is disposed on the display substrate 110 to form a stretching structure layer 130, the stretching structure layer 130 is preheated and pre-stretched, and the stretching structure layer 130 is cooled to form a stretchable wavy structure 1301. According to this, when the bending region 111 of the display substrate 110 is bent, stress can be released by the above-mentioned wavy stretching structure layer 130, the fracture phenomenon of the metal routing 150 can be reduced, and the probability of occurrence of wrinkles in the bending region 111 can be reduced.

As shown in FIGS. 3 and 4, in the present arrangement, at least a portion of the bending region 111 is provided with an inorganic layer 140. The inorganic layer 140 includes a barrier dam 1401 disposed on the bending region 111 of the display substrate 110, and each of stretching structure layers 130 and flexible filling layers 120 on its two sides (both sides in the length direction F of the bending region 111) are respectively blocked by a barrier dam 1401. Accordingly, the present disclosure is capable of separating the stretching structure layer 130 from the flexible filling layer 120 adjacent to the stretching structure layer by the barrier dam 1401 of the inorganic layer 140, facilitating the formation of respective stacked structures and the realization of the stretching function.

Specifically, as shown in FIG. 3 and FIG. 4, in the arrangement, the inorganic layer 140 may include a buffer layer 141, a gate insulating (abbreviated as GI) layer 142, and a inter layer dielectric (abbreviated ILD) 143. The buffer layer 141 is disposed on the display substrate 110. The gate insulating layer 142 is disposed on the buffer layer 141. The inter layer dielectric 143 is disposed on the gate insulating layer 142.

Further, as shown in FIG. 3 and FIG. 4, in the arrangement, the inorganic layer 140 may include two gate insulating layers 142, i.e., a first gate insulating layer 1421 and a second gate insulating layer 1422. These two gate insulating layers are sequentially disposed on the buffer layer 141.

Referring to FIG. 5, a partial structural view of a display substrate proposed by the present disclosure in another exemplary arrangement is representatively shown. Based on the above detailed description of an exemplary arrangement of the display substrate proposed by the present disclosure, a second arrangement of the display substrate proposed by the present disclosure will be described below. The design of the display substrate in the second arrangement is substantially the same as that in the first arrangement described above, and the main differences therebetween are as follows:

As shown in FIG. 5, in the present arrangement, the display substrate 110 is used for attaching with the cover of the following structure, that is, the cover is integrally bent in the first direction D1 (the first direction is parallel to the length direction F of the bending region 111 of the display substrate 110 after the cover is attached to the display substrate 110), so that the cover is substantially a curved surface structure which is integrally bent. When attached to the cover of the above structure, the display substrate 110 is bent into a structure that matches with the curved surface structure, and the display substrate 110 is substantially bent integrally in the length direction F of the bending region 111.

For the above structure of the display substrate 110, the display substrate 110 may be provided with only one stretching structure layer 130, and the stretching structure layer 130 may be located at a central position of the bending region 111 in the length direction F.

In addition, the display substrate 110 may also be provided with a plurality of stretching structure layers 130, which may be located at a middle position of the bending region 111, and the plurality of stretching structure layers 130 are alternately arranged with the flexible filling layer 120.

Figure 6:
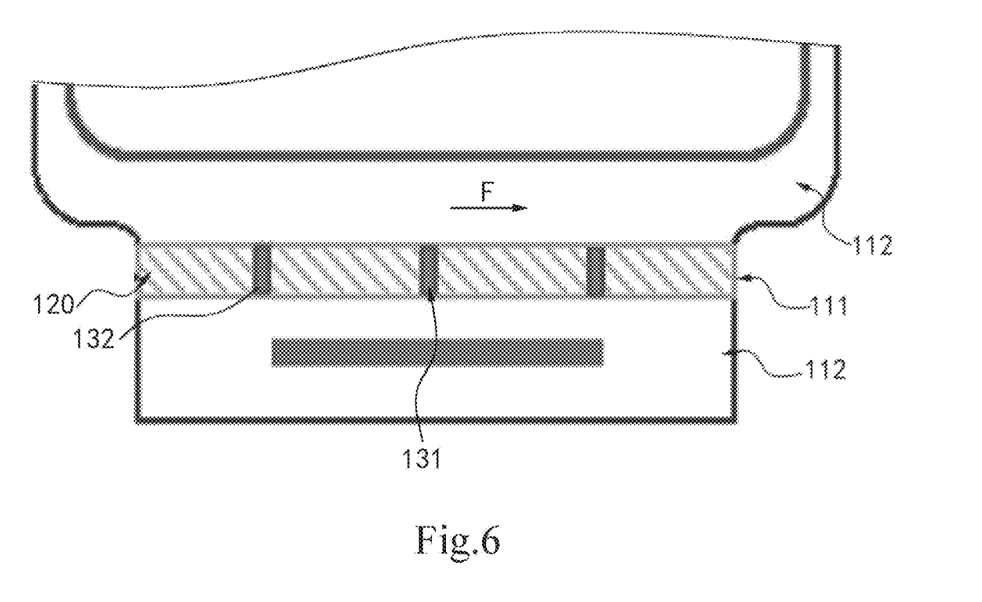
FIG. 6 is a partial structural view of a display substrate according to still another exemplary arrangement.

Referring to FIG. 6, a partial structural view of a display substrate proposed by the present disclosure in still another exemplary arrangement is representatively shown. Based on the above detailed description of the first arrangement and the second arrangement of the display substrate proposed in the present disclosure, a third arrangement of the display substrate proposed by the present disclosure will be described below. The design of the display substrate in the third arrangement is substantially the same as the design in the first arrangement and the second arrangement described above, and the main difference of the third arrangement from the above arrangements are as follows:

As shown in FIG. 6, in the present arrangement, the display substrate 110 is still used for attaching with the cover mentioned in the second arrangement. The stretching structure layer 130 disposed on the display substrate 110 may further include a first stretching structure layer 131 and a second stretching structure layer 132. The first stretching structure layer 131 may be disposed at a central position of the bending region 111 in the length direction F, there may be two second stretching structure layers 132, and the two second stretching structure layers 132 are respectively disposed at the positions of the bending region 111 adjacent to two ends thereof in the length direction F.

In addition, the display substrate 110 may also be provided with a plurality of first stretching structure layers 131. The first stretching structure layers 131 may be located at a middle position of the bending region 111, and the plurality of first stretching structure layers 131 are alternately arranged with the flexible filling layer 120.

In addition, the second stretching structure layer 132 may also be divided into two groups disposed at the positions of the bending region 111 adjacent to two ends thereof in the length direction F, and the number of the second stretching structure layers 132 may be plural. When there are a plurality of second stretch structure layers 132 in the same group, an alternate arrangement with the flexible filling layer 120 may also be employed.

It should be noted herein that the display substrates illustrated in the drawings and described in this specification are merely a few examples of many types of display substrates that can employ the principles of the present disclosure. It should be clearly understood that the principles of the present disclosure are in no way limited to any detail of the display substrate or any component of the display substrate shown in the drawings or described in this specification.

For example, as shown in FIGS. 3 to 4, in the present arrangement, the stacked structure of the display substrate 110 proposed by the present disclosure may further include a planarization layer 160 (PLN) and an organic film layer 170 (PDL). The planarization layer 160 may be disposed on the metal routing 150, and the organic film layer 170 may be disposed on the planarization layer 160.

Based on the above detailed description of several arrangements of the display substrate proposed by the present disclosure, a first exemplary arrangement of the display device proposed by the present disclosure will be described below. The display device proposed by the present disclosure is exemplified as a curved surface display screen applied to a mobile phone. It will be readily understood by those skilled in the art that various modifications, additions, substitutions, deletions or other variations are made to the specific arrangements described below in order to apply the related design of the present disclosure to other types of display products or other devices. These variations are still within the scope of the principles of the display device proposed by the present disclosure.

In the present arrangement, the display device may be, for example, a curved surface display screen, and the display device mainly includes a cover and a display substrate proposed by the present disclosure and described in detail in the above arrangements.

Specifically, in the present arrangement, the cover is specifically a curved surface structure in which both side portions are bent and the middle portion is flat. Correspondingly, the specific structure of the display substrate can refer to the design in the first arrangement of the display substrate. Accordingly, the display device formed by attaching the display substrate with the cover is substantially a curved surface display screen in which both side portions are bent and the middle portion is flat.

Based on the above detailed description of an exemplary arrangement of the display device proposed by the present disclosure, a second arrangement of the display device proposed by the present disclosure will be described below. The design of the display device in the second arrangement is substantially the same as that in the first arrangement described above, and the main differences therebetween are as follows:

In the present arrangement, the cover is specifically a curved surface structure that is integrally bent in the first direction D1 (i.e., the width direction of the curved surface display screen). Correspondingly, the specific structure of the display substrate can refer to the design in the second arrangement of the display substrate. Accordingly, the display device formed by attaching the display substrate with the cover is substantially a curved surface display screen which is integrally bent in the width direction.

Based on the above detailed description of the first arrangement and the second arrangement of the display device proposed in the present disclosure, a third arrangement of the display device proposed by the present disclosure will be described below. The design of the display device in the third arrangement is substantially the same as that in the first arrangement and the second arrangement described above, and the main differences therebetween are as follows:

In the present arrangement, the cover is specifically a curved surface structure that is integrally bent in the first direction D1 (i.e., the width direction of the curved surface display screen). Correspondingly, the specific structure of the display substrate can refer to the design in the third arrangement of the display substrate. That is, the stretching structure layer provided on the display substrate further includes a first stretching structure layer and a second stretching structure layer. The first stretching structure layer is disposed at a central position in the length direction of the bending region, and there are at least two second stretching structure layers provided in the length direction, which are respectively disposed at positions of the bending portion adjacent to two ends thereof in the length direction. Accordingly, the display device formed by attaching the display substrate with the cover is substantially a curved surface display screen which is integrally bent in the width direction.

It should be noted herein that the display devices illustrated in the drawings and described in this specification are merely a few examples of many types of display devices that can employ the principles of the present disclosure. It should be clearly understood that the principles of the present disclosure are in no way limited to any detail of the display device or any component of the display device shown in the drawings or described in the specification.

Based on the above detailed description of several arrangements of the display substrate and the display device proposed by the present disclosure, an exemplary arrangement of the mobile terminal proposed by the present disclosure will be described below. The mobile terminal proposed by the present disclosure is exemplified as a mobile device of a display device of a curved surface display screen. It will be readily understood by those skilled in the art that various modifications, additions, substitutions, deletions or other variations are made to the specific arrangements described below in order to apply the related designs of the present disclosure to other types of display devices or other processes. These variations are still within the scope of the principles of the display substrate provided by the present disclosure.

In this arrangement, the mobile terminal proposed by the present disclosure may be, for example, a mobile phone or an IPAD, and the mobile terminal includes a display screen. The display screen is a curved surface display screen, i.e., the display device proposed in the present disclosure and in the above arrangement.

It should be noted herein that the mobile terminal shown in the drawings and described in this specification is merely an example of many types of mobile terminals capable of employing the principles of the present disclosure. It should be clearly understood that the principles of the present disclosure are in no way limited to any details of the mobile terminal or any component of the mobile terminal shown in the drawings or described in the specification.

Based on the above detailed description of several arrangements of the display substrate and the display device proposed in the present disclosure, an exemplary arrangement of a fabricating method of a display substrate proposed by the present disclosure will be described below.

In the present arrangement, the present disclosure provides a fabricating method of a display substrate. The fabricating method of the display substrate includes the following operations: providing a substrate, the substrate comprising a bending region and a non-bending region adjacent to the bending region; providing a flexible filling layer in at least a portion of the bending region of the substrate, and providing an inorganic layer in at least a portion of the non-bending region of the substrate; providing at least one stretching structure layer in the bending region, the stretching structure layer and the flexible filling layer being alternately arranged; and providing a metal routing, a planarization layer, and an organic film layer on the flexible filling layer, the inorganic layer, and the stretching structure layer.

Further, in the arrangement, the fabricating method of the display substrate proposed by the present disclosure may further include the following operations: preheating and stretching the stretching structure layer; cooling the stretching structure layer to form a stretchable wavy structure.

It should be noted herein that the fabricating method of the display substrate illustrated in the drawings and described in the specification is merely one example of many fabricating methods of a display substrate capable of employing the principles of the present disclosure. It should be clearly understood that the principles of the present disclosure are in no means limited to any detail or any operation of the fabricating method of the display substrate shown in the drawings or described in the specification.

In summary, the display substrate proposed by the present disclosure includes a stretching structure layer disposed in a bending region, and the stretching structure layer is alternately distributed with the flexible filling layer disposed in the bending region. According to the above design of the present disclosure, a stretching structure layer is disposed on the bending region of the display substrate, so that stress is released by the stretching structure layer at a position where stress concentration is expected to occur, and the bending region of the display substrate may be completely attached to the cover of the new 3D structure to meet the attaching requirements, avoiding the short line or broken defects.

Exemplary arrangements of the display substrate, the display device, the mobile terminal, and the fabricating method of the display substrate provided by the present disclosure are described and/or illustrated in detail above. However, arrangements of the present disclosure are not limited to the specific arrangements described herein, but rather, the components and/or operations of each arrangement can be used independently and separately from the other components and/or operations described herein. Each component and/or each operation of an arrangement may also be used in combination with other components and/or operations of other arrangements. When introducing elements/components/etc. described and/or illustrated herein, the terms such as "a", "an", "the" and "said" are used to indicate the presence of one or more elements/components. The terms "comprise", "include", "have", "contain" and their variants are used to be open-type and are meant to include additional elements/components, etc., in addition to the listed elements/components/etc. In addition, the terms "first", "second", etc. are used only as marks, rather than limitation for the number of objects.

While the display substrate, the display device, the mobile terminal, and the fabricating method of the display substrate of the present disclosure have been described in terms of various specific arrangements, those skilled in the art will recognize that the implementation of the present disclosure can be modified within the spirit and scope of the claims.

What is claimed is:

1. A display substrate, comprising:
   an inorganic layer_and a flexible filling layer, wherein the display substrate comprises a bending region and a non-bending region adjacent to the bending region, the inorganic layer is located in at least a portion of the non-bending region, and the flexible filling layer is located in at least a portion of the bending region, and
   a stretching structure layer disposed in the bending region, the stretching structure layer and the flexible filling layer being alternately distributed in a length direction of the bending region, the stretching structure layer being made of polydimethylsiloxane, wherein:
   the inorganic layer is located in at least a portion of the bending region, the inorganic layer comprises a buffer layer disposed on the display substrate, a gate insulating layer disposed on the buffer layer, and an inter layer dielectric disposed on the gate insulating layer; and
   the inorganic layer comprises a barrier dam disposed in the bending region, wherein, in the length direction of the bending region, the barrier dam is provided between each of a plurality of stretching structure layers and the flexible filling layer on both sides thereof, respectively.

2. The display substrate according to claim 1, wherein the inorganic layer comprises two gate insulating layers sequentially disposed on the buffer layer.

3. The display substrate according to claim 1, wherein the stretching structure layer is configured as a wavy structure.

4. A display device, comprising:
   a cover and a display substrate attached to the cover, wherein the display substrate comprises an inorganic layer and a flexible filling layer, the display substrate comprises a bending region and a non-bending region adjacent to the bending region, the inorganic layer is located in at least a portion of the non-bending region, and the flexible filling layer is located in at least a portion of the bending region; and
   a first stretching structure layer disposed in the bending region, the first stretching structure layer and the flexible filling layer being alternately distributed_in a length direction of the bending region, the stretching structure layer being made of polydimethylsiloxane, wherein:
   the inorganic layer is located in at least a portion of the bending region, the inorganic layer comprises a buffer layer disposed on the display substrate, a gate insulating layer disposed on the buffer layer, and an inter layer dielectric disposed on the gate insulating layer; and
   the inorganic layer comprises a barrier dam disposed in the bending region, wherein, in the length direction of the bending region, the barrier dam is provided between each of a plurality of stretching structure layers and the flexible filling layer on both sides thereof, respectively.

5. The display device according to claim 4, wherein:
   the cover is provided with a middle portion and two side portions on both sides of the middle portion, the middle portion is a planar structure, each of the two side portion is a curved surface structure, and positions at which the two side portions are connected to the middle portion defining two curved boundary lines, respectively; and
   the display substrate comprises two second stretching structure layers, and extensions of the two curved boundary lines on an upper surface of the cover passing through orthographic projections of the two second stretching structure layers on the upper surface of the cover, respectively.

6. The display device according to claim 5, wherein the cover is a curved surface structure integrally bent in a first direction which is parallel to a length direction of the bending region of the display substrate; and
   wherein at least one of the two second stretching structure layers of the display substrate is located at a middle position of the bending region.

7. The display device according to claim 6, wherein the two second stretching structure layers of the display substrate are located at both sides of the first stretching structure layer in a length direction of the bending region, respectively.

* * * * *